United States Patent [19]

Ouchi et al.

[11] Patent Number: 4,592,093
[45] Date of Patent: May 27, 1986

[54] SUPER HIGH FREQUENCY RECEIVER

[75] Inventors: Koji Ouchi; Shinobu Tsurumaru; Tadashi Kajiwara, all of Kanagawa; Kenichiro Kumamoto, Tokyo, all of Japan

[73] Assignee: Sony Corporation, Tokyo, Japan

[21] Appl. No.: 688,544

[22] Filed: Jan. 3, 1985

[30] Foreign Application Priority Data

Jan. 13, 1984 [JP] Japan .................... 59-5391

[51] Int. Cl.$^4$ .................. H04N 7/16; H04B 3/44; H04B 1/26
[52] U.S. Cl. .................. 455/4; 455/6; 455/131; 455/189; 455/190; 358/86
[58] Field of Search .............. 455/3, 4, 6, 131, 189, 455/190, 196–199, 257, 258; 358/86

[56] References Cited

U.S. PATENT DOCUMENTS 4,205,269 5/1980 Watanabe ............. 358/86
4,509,198 4/1985 Nagatomi ............. 455/131

FOREIGN PATENT DOCUMENTS 63105 5/1980 Japan .................. 455/131
15335 1/1984 Japan .................. 358/86

Primary Examiner—Jin F. Ng
Attorney, Agent, or Firm—Lewis H. Eslinger; Alvin Sinderbrand

[57] ABSTRACT

Apparatus for receiving super high frequency signals having an outdoor unit which includes a converter for converting super high frequency signals received by an antenna to ultra high frequency signals, a local oscillator for generating a local signal supplied to the converter a switch for switching the frequency of the local signal, and a detecting circuit for detecting an operating voltage supplied to the outdoor unit and the value of which is changed according to a band range of the super high frequency signals, the output of the detecting circuit controlling the switch, an indoor unit which includes a demodulator demodulating the ultra high frequency signals, and a circuit generating the operating voltage; and a coaxial cable supplying the ultra high frequency signals from the outdoor unit to the indoor unit and also supplying the operating voltage from the indoor unit to the outdoor unit.

7 Claims, 3 Drawing Figures

SUPER HIGH FREQUENCY RECEIVER

BACKGROUND OF THE INVENTION

1. Field of the Invention

This invention relates generally to an apparatus for receiving a super high frequency (SHF) signal and more particularly to an SHF receiver for receiving SHF broadcast signals from, for example, a broadcast satellite.

2. Description of the Prior Art

Generally, as shown in, for example, FIG. 1, an SHF receiver receiving an SHF broadcast signal from a broadcast satellite (not shown) consists of an antenna 1, an outdoor unit 2 installed in the outside of a house together with the antenna 1 to frequency-convert an electrical wave of an SHF band that is received by the antenna 1 to an electrical wave of a UHF band and to amplify the same, a coaxial cable 3, an indoor unit 4 and a television receiver 5 both installed inside the house. The indoor unit 4 is supplied with the signal that is frequency-converted to the ultra high frequency (UHF) band signal from the outdoor unit 2 through the coaxial cable 3 and derives a video signal and an audio signal that are supplied to the television receiver 5.

By the way, there are considered, for example, a low power broadcast (receiving frequency is 11.7 to 12.2 GHz) and a high power broadcast (receiving frequency is 12.2 to 12.7 GHz) for the SHF broadcast.

However, in the above SHF receiver, if the local oscillation frequency in the outdoor unit 2 is not changed over, the indoor unit 4 must correspond to the frequency band of 1000 MHz in view of frequency and it becomes extremely difficult to realize the indoor unit 4 in circuitry standpoint.

Accordingly, in order to receive two broadcast different in frequency band by the indoor unit 4 of simple construction, the local oscillation frequency in the outdoor unit 2 must be changed over.

To change over the local oscillation frequency in the outdoor unit 2, it may be considered that in addition to the coaxial cable 3, for example, there is provided independently a local oscillation frequency control cable that is extended from the indoor unit 4 to the outdoor unit 2 and the switching of the local oscillation frequency is controlled therethrough. However, it is undesirable that a plurality of cables are provided between the outdoor unit 2 and the indoor unit 4 in signal transmission standpoint. Also, the plurality of cables cause the number of the terminals of the outdoor unit 2 to be increased, which is not preferable in air-tight state standpoint to avoid the leakage of, for example, rainwater into the outdoor unit 2.

OBJECTS AND SUMMARY OF THE INVENTION

Accordingly, it is an object of this invention to provide an improved super high frequency (SHF) receiver.

It is another object of this invention to provide an SHF receiver in which without increasing the number of coaxial cables connected between an outdoor unit and an indoor unit, the local oscillation frequency in the outdoor unit can be changed over in accordance with a receiving band.

It is a further object of this invention to provide an SHF receiver which is free of disadvantages caused by the increase of the number of the terminals of the outdoor unit in signal transmission and air-tightness standpoint.

According to one aspect of this invention, there is provided an apparatus for receiving super high frequency signals, the apparatus comprising:

an outdoor unit having means for converting super high frequency signals to ultra high frequency signals, local oscillator means for generating a local signal which is supplied to said converting means, means for switching the frequency of said local signal, and means for detecting an operating voltage which is supplied to said outdoor unit and the value of which is changed according to a band range of said super high frequency signals, the output of said detecting means controlling said switching means;

an indoor unit having means for demodulating said ultra high frequency signals, and means for generating said operating voltage; and cable means for supplying said ultra high frequency signals from said outdoor unit to said indoor unit and supplying said operating voltage from said indoor unit to said outdoor unit.

The other objects, features and advantages of the present invention will become apparent from the following description taken in conjunction with the accompanying drawings through which the like references designate the same elements and parts.

DESCRIPTION OF THE PREFERRED EMBODIMENT

Figure 3:
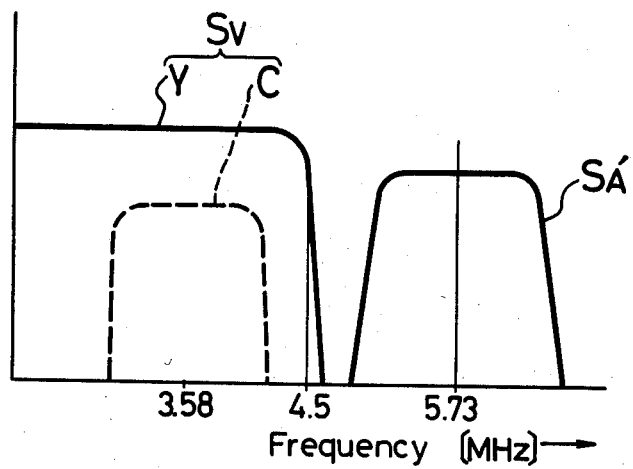
FIG. 3 is a waveform diagram useful for the explanation thereof.

Now, an embodiment of an SHF receiver according to this invention will hereinafter be described with reference to FIGS. 2 and 3.

Figure 1:
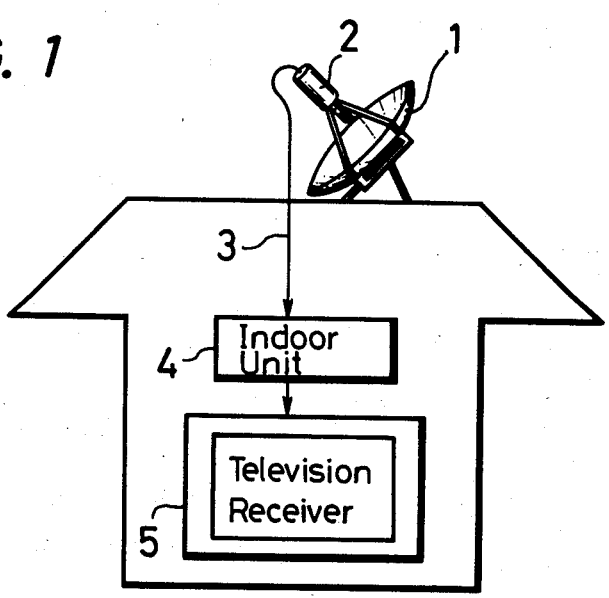
FIG. 1 is a schematic diagram showing an example of a prior art SHF receiver.
Figure 2:
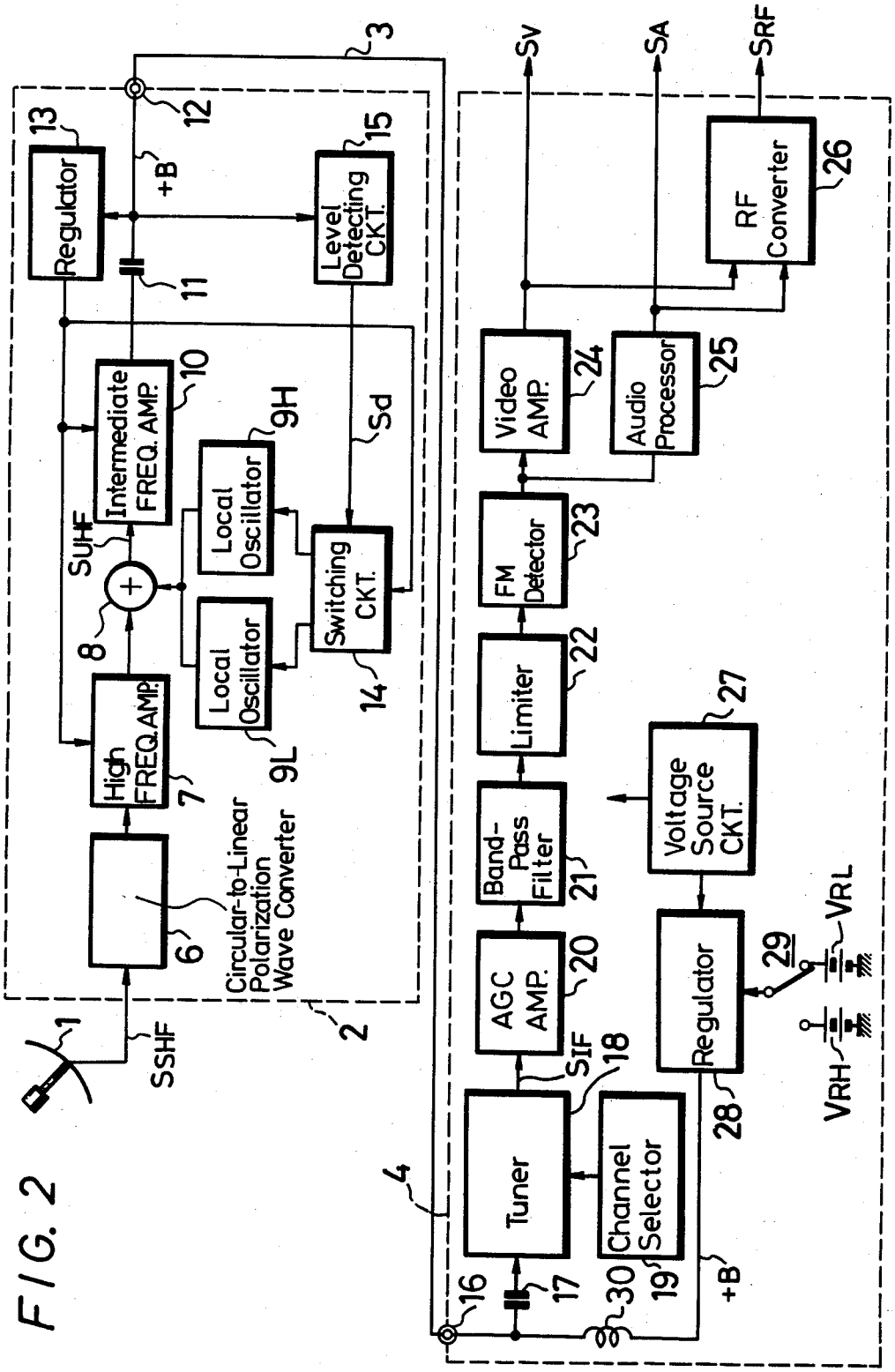
FIG. 2 is a block diagram showing an embodiment of an SHF receiver according to this invention.

In FIG. 2, like parts corresponding to those in FIG. 1 are marked with the same reference and will not be described in detail.

In FIG. 2, an SHF broadcast signal $S_{SHF}$ received by the antenna 1 is converted from a circular polarized super high frequency signal to a linear polarized super high frequency signal by a circular-to-linear polarization wave converter 6 that is a part of the outdoor unit 2 and then supplied through a high frequency amplifier 7 to a mixer 8.

Reference numerals 9L and 9H respectively designate local oscillators which produce, for example, a frequency signal of 10.705 GHz (for receiving a low power broadcast) and a frequency signal of 11.2 GHz (for receiving a high power broadcast), respectively. The frequency signals from the local oscillators 9L and 9H are respectively supplied to the mixer 8. Then, this mixer 8 produces a signal $S_{UHF}$ that is frequency-converted to a signal of UHF (ultra high frequency) band. This signal $S_{UHF}$ is supplied through an intermediate frequency amplifier 10 and a capacitor 11 for a D.C. blocking capacitor 11 to an output terminal 12.

Reference numeral 13 designates a regulator which is supplied with a voltage $+B$ that is supplied from the indoor unit 4 through the coaxial cable 3 to the terminal 12 and in which this voltage $+B$ is stabilized. As will be mentioned later, the voltage $+B$ that is supplied to the output terminal 12 is made +10 V and +15 V for receiving the low power broadcast (receiving frequency is 11.7 to 12.2 GHz) and the high power broadcast (receiving frequency is 12.2 to 12.7 GHz). The voltage that is stabilized by the regulator 13 to be a predetermined voltage is supplied to the high frequency amplifier 7 and the intermediate frequency amplifier 10 and also supplied through a switching circuit 14 to the local oscillators 9L and 9H.

Reference numeral 15 designates a level detecting circuit to which the voltage +B, that is supplied to the output terminal 12, is supplied from the indoor unit 4, and the level detecting circuit 15 detects whether the level of the voltage +B is +10 V or +15 V. A detected output signal Sd therefrom is supplied to the switching circuit 14 as its switching control signal. The switching circuit 14 is connected to the local oscillator 9L when the voltage +B is +10 V, or when receiving the low power broadcast (the receiving frequency is 11.7 to 12.2 GHz), while when the voltage +B is 15 V, or when receiving the high power broadcast (the receiving frequency is 12.2 to 12.7 GHz), the switching circuit 14 is connected to the local oscillator 9H.

Accordingly, when receiving the low power broadcast, the operating voltage is supplied from the regulator 13 to the local oscillator 9L and the frequency signal of 10.705 GHz is supplied from this local oscillator 9L to the mixer 8, thus the SHF receiver being set in the low power broadcast receiving mode. On the other hand, when receiving the high power broadcast, the operating voltage is supplied from the regulator 13 to the local oscillator 9H and the frequency signal of 11.2 GHz is supplied from the local oscillator 9H to the mixer 8, thus the SHF receiver being set in the high power broadcast receiving mode.

The signal $S_{UHF}$ the frequency of which is converted to that of the UHF band and delivered to the output terminal 12 of the outdoor unit 2 is supplied through the coaxial cable 3, an input terminal 16 and a D.C. blocking capacitor 17 to a tuner 18 that are a part of the indoor unit 4.

In this tuner 18, the broadcast of a predetermined channel is selected by the control of a channel selector 19 and an intermediate frequency signal (FM signal) $S_{IF}$ of the selected broadcast is produced at the output side of the tuner 18. This signal $S_{IF}$ is supplied through a series circuit of an AGC (automatic gain control) amplifier 20, a band-pass filter 21 and a limiter 22 to an FM-detector 23. From this FM-detector 23 is derived a composite signal that consists of a video signal $S_V$ formed of a luminance signal Y and a chrominance signal C and an audio signal $S_A'$ that is 4-phase-shift keyed (4 PSK) as shown in, for example, FIG. 3. This composite signal is supplied to a video amplifier 24 and an audio processor 25.

The video amplifier 24 produces the amplified video signal $S_V$ and the audio processor 25 produces an audio signal $S_V$.

The video signal $S_V$ from the video amplifier 24 and the audio signal $S_A$ from the audio processor 25 are both supplied to an RF (radio frequency) converter 26, and this RF converter 26 produces a television signal $S_{RF}$ that is matched with, for example, a vacant channel.

In the indoor unit 4, reference numeral 27 designates a voltage source circuit which supplies a necessary voltage to each section of the indoor unit 4 and a predetermined voltage to a regulator 28. Depending on receiving the low power broadcast or the high power broadcast, this regulator 27 is supplied with different reference voltage $V_{RL}$ or $V_{RH}$ through a switching circuit 29. Then, this regulator 28 produces at its output side the voltage +B of, for example, +10 V in receiving the low power broadcast and the voltage +B of, for example, +15 V in receiving the high power broadcast. This voltage +B is supplied through an A.C. blocking coil 30, the terminal 16 and the coaxial cable 3 to the terminal 12 of the terminal 16 and the coaxial cable 3 to the terminal 12 of the outdoor unit 2 as described above.

Since the SHF receiver according to this embodiment is constructed as mentioned above, when receiving the low power broadcast (the receiving frequency is 11.7 to 12.2 GHz), the voltage +B that is supplied from the indoor unit 4 through the coaxial cable 3 to the terminal 12 of the outdoor unit 2 is made to be, for example, +10 V and the operating voltage is supplied to the local oscillator 9L by the control of the level detecting circuit 15 so that the frequency signal of 10.705 GHz is supplied from the local oscillator 9L to the mixer 8 and thus the outdoor unit 2 is set in the receiving mode for receiving the low power broadcast. On the other hand, when receiving the high power broadcast (the receiving frequency is 12.2 to 12.7 GHz), the voltage +B that is similarly supplied to the terminal 12 of the outdoor unit 2 is made to be, for example, +15 V and the operating voltage is supplied to the local oscillator 9H by the control of the level detecting circuit 15 so that the frequency signal of 11.2 GHz is supplied from the local oscillator 9H to the mixer 8 and thus the outdoor unit 2 is set in the receiving mode for receiving the high power broadcast. Accordingly, the SHF receiver of this embodiment can receive the both low power broadcast and the high power broadcast.

According to this embodiment, only the signal coaxial cable 3 at minimum is provided between the outdoor unit 2 and the indoor unit 4 similar to the prior art and without increasing the number of the coaxial cables, it is possible to change the receiving bands of the local oscillation frequency in the outdoor unit 2. Thus, it is possible to prevent disadvantages from being caused by the increase of the number of the coaxial cables in signal transmission and air-tight standpoint.

While in the above embodiment the local oscillators 9L and 9H are respectively changed over to switch the local oscillation frequency in the outdoor unit 2, it is possible that a single local oscillator is provided and its local oscillation frequency is changed over in accordance with the receiving band.

As is clear from the embodiment as mentioned above, according to this invention, without increasing the number of the coaxial cables provided between the outdoor unit and the indoor unit, it is possible to change over the local oscillation frequency in the outdoor unit in accordance with the receiving band. Accordingly, it is possible to prevent the disadvantages caused by the increase of the number of the cables in signal transmission and air-tight standpoint.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

We claim as our invention:

1. Apparatus for receiving super high frequency signals, the apparatus comprising:

an outdoor unit having means for converting super high frequency signals to ultra high frequency signals, local oscillator means for generating a local signal which is supplied to said converting means, means for switching the frequency of said local signal, and means for detecting an operating voltage which is supplied to said outdoor unit and the value of which is changed according to a band range of said super high frequency signals, the output of said detecting means controlling said switching means;

an indoor unit having means for demodulating said ultra high frequency signals, and means for generating said operating voltage; and cable means for supplying said ultra high frequency signals from said outdoor unit to said indoor unit and supplying said operating voltage from said indoor unit to said outdoor unit.

2. Apparatus according to claim 1, in which said local oscillator means comprises first and second local oscillators having different frequencies, an output signal of either of said oscillators being supplied to said converting means.

3. Apparatus according to claim 2, in which said outdoor unit further comprises a regulator for stabilizing said operating voltage, the output of said regulator being supplied to either of said oscillators selectively by said switching means.

4. Apparatus according to claim 1, in which said local oscillator means is a variable frequency oscillator, whose frequency is varied by said switching means.

5. Apparatus according to claim 1, in which said converting means comprises a converter for converting circular polarized super high frequency signals to linear polarized super high frequency signals, an amplifier supplied with said linear polarized super high frequency signals, and a mixer supplied with the output of said amplifier and said local signal, said mixer producing said ultra high frequency signals, and said demodulating means comprises a tuner supplied with said ultra high frequency signals, a channel selector for selecting a channel of said ultra high frequency signals, said channel selector controlling the channel selection in said tuner, a detector for detecting the output signal of said tuner, and means for processing the output signal of said detector, said processing means producing a video signal and an audio signal, respectively.

6. Apparatus according to claim 5, further comprising antenna means for supplying said circular polarized super high frequency signals received thereat to said converter.

7. Apparatus according to claim 6, further comprising monitor means supplied with said video signal and said audio signal.

* * * * *